(12) United States Patent
Hamada

(10) Patent No.: US 7,304,426 B2
(45) Date of Patent: Dec. 4, 2007

(54) ORGANIC ELECTROLUMINESCENT DISPLAY HAVING A LIGHT EMITTING LAYER PRODUCING THE WAVELENGTHS OF RED, GREEN AND BLUE

(75) Inventor: Yuji Hamada, Nara (JP)

(73) Assignee: Sanyo Electric Co., Ltd., Osaka (JP)

( * ) Notice: Subject to any disclaimer, the term of this patent is extended or adjusted under 35 U.S.C. 154(b) by 282 days.

(21) Appl. No.: 11/091,405

(22) Filed: Mar. 29, 2005

(65) Prior Publication Data

US 2005/0218799 A1 Oct. 6, 2005

(30) Foreign Application Priority Data

Mar. 31, 2004 (JP) ............... 2004-105813
Jan. 31, 2005 (JP) ............... 2005-023085

(51) Int. Cl.
*H01J 1/62* (2006.01)
*H01J 63/04* (2006.01)

(52) U.S. Cl. ............... 313/501; 313/504; 313/506
(58) Field of Classification Search ........... 313/110, 313/501, 504, 506
See application file for complete search history.

(56) References Cited

U.S. PATENT DOCUMENTS 5,757,452 A    5/1998    Masaki et al.

2001/0000005 A1* 3/2001 Forrest et al. ......... 204/192.12
2003/0127968 A1* 7/2003 Kuma et al. ............... 313/503

FOREIGN PATENT DOCUMENTS

| EP | 1 115 269 | 7/2001 |
|---|---|---|
| JP | 08-234187 | 9/1996 |
| JP | 11-260562 | 9/1999 |
| JP | 2001-60495 | 3/2001 |
| JP | 2004-39468 | 2/2004 |

OTHER PUBLICATIONS

"Organic EL Materials and Displays" with partial translation, pp. 346-348.

* cited by examiner

*Primary Examiner*—Joseph Williams
*Assistant Examiner*—Bumsuk Won
(74) *Attorney, Agent, or Firm*—McDermott Will & Emery LLP

(57) ABSTRACT

A light emitting layer produces light having peak intensities in a wavelength range of not less than 460 nm and not more than 510 nm and a wavelength range of not less than 550 nm and not more than 640 nm, respectively. Each of a red color filter layer, green color filter layer, and blue color filter layer has a transmittance of 50% or more in a prescribed wavelength range and a transmittance of 10% or less in a prescribed wavelength range. The ratio of an intensity value of the light emitted from the light emitting layer at a wavelength of 575 nm to an intensity value of the light emitted at a wavelength of 475 nm is not less than 0.4 and not more than 4.0.

5 Claims, 14 Drawing Sheets

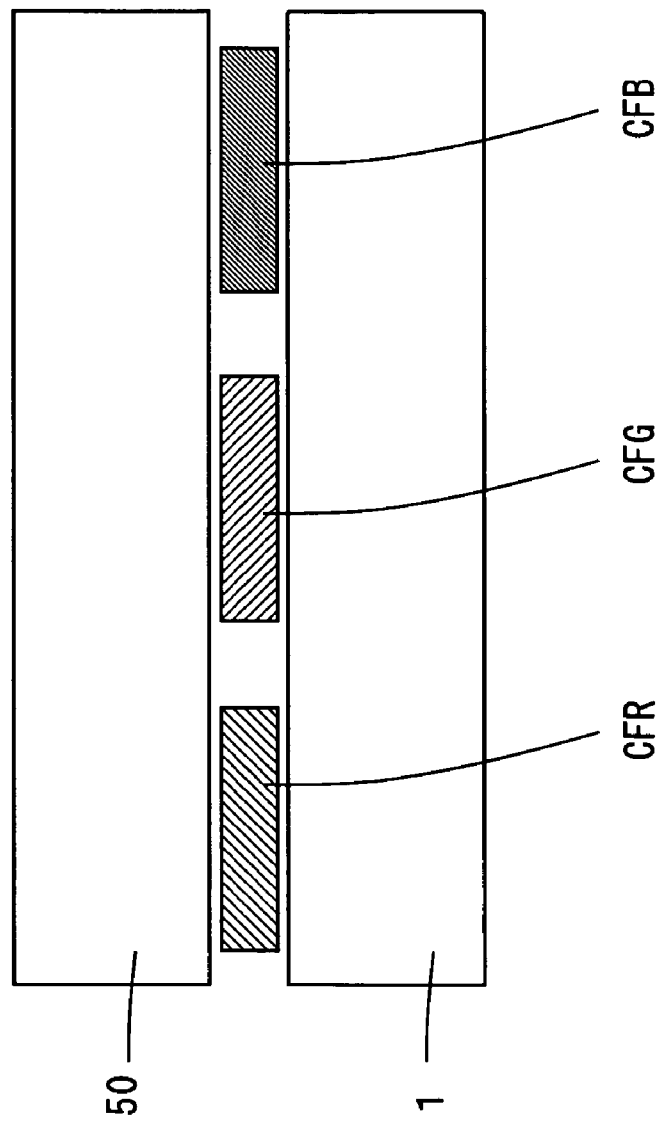

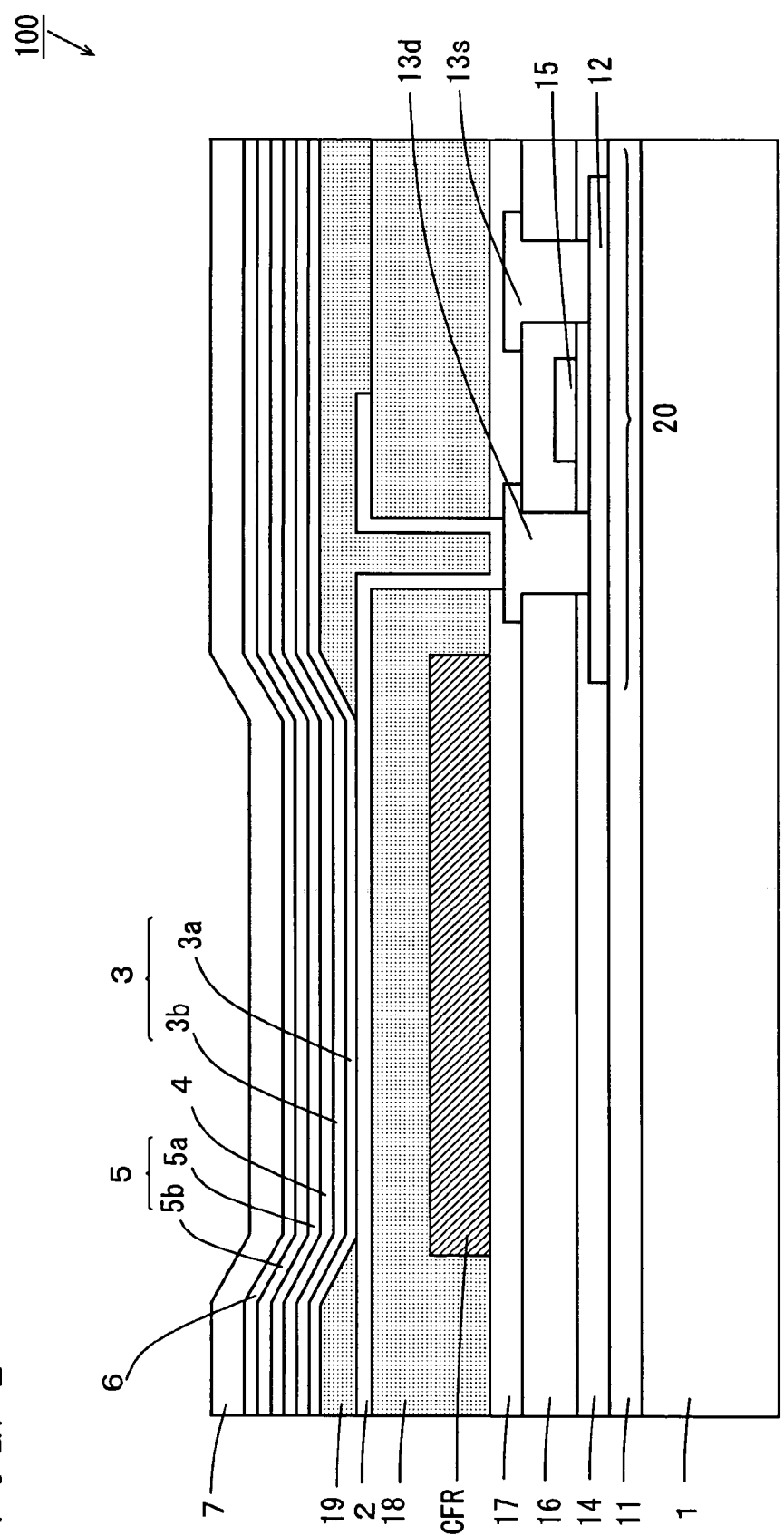

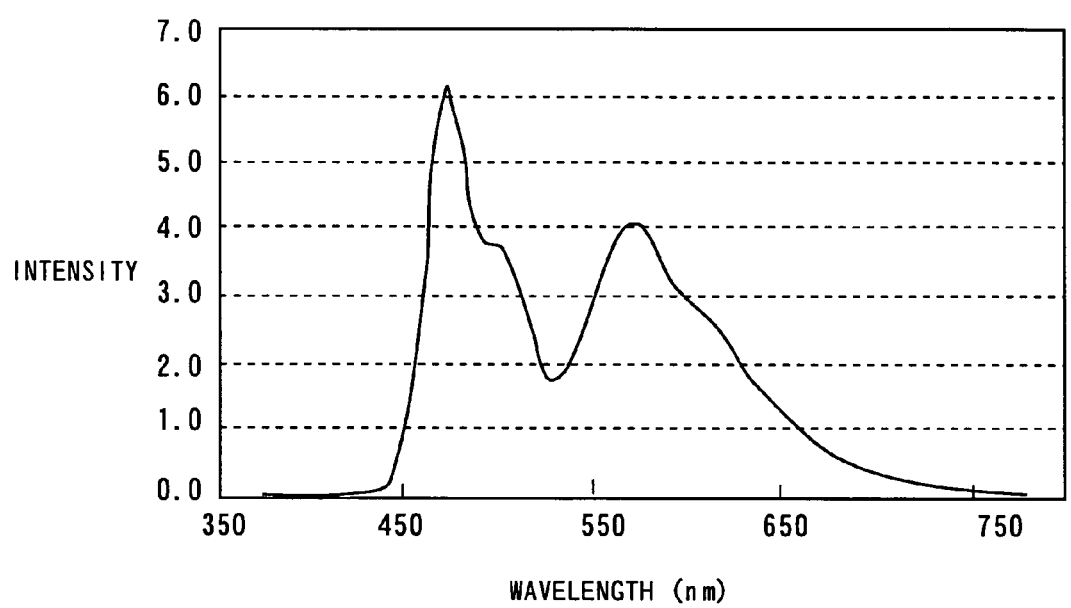
F I G. 6

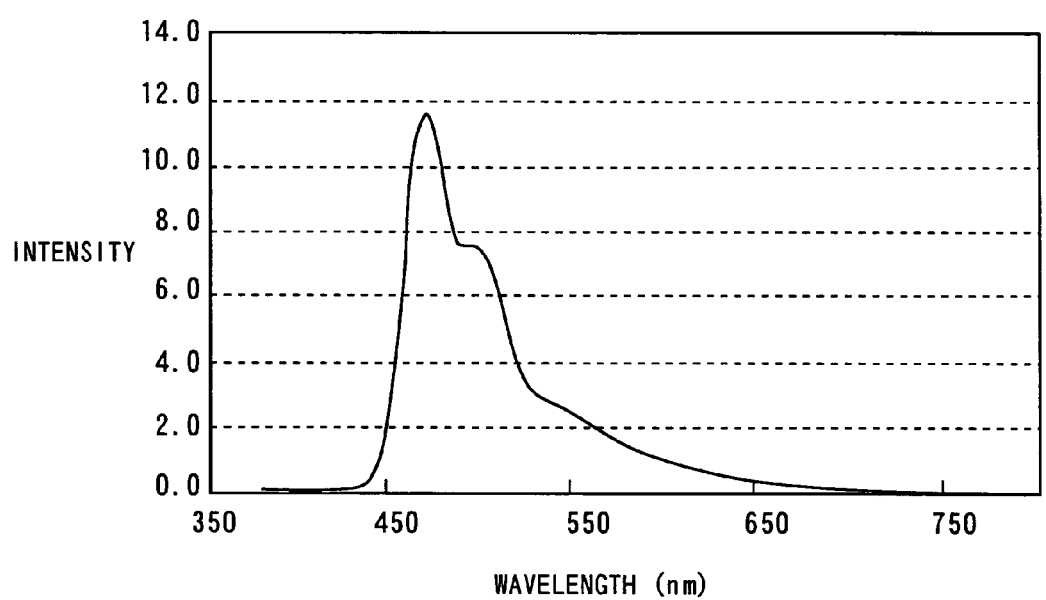
F I G. 1 2

ORGANIC ELECTROLUMINESCENT DISPLAY HAVING A LIGHT EMITTING LAYER PRODUCING THE WAVELENGTHS OF RED, GREEN AND BLUE

BACKGROUND OF THE INVENTION

1. Field of the Invention

The present invention relates to an organic electroluminescent display using a plurality of organic electroluminescent devices.

2. Description of the Background Art

With the recent diversification of information equipment, there is a growing need for flat panel displays that require lower power consumption than commonly used CRTs (cathode ray tubes). As one of the flat panel displays, organic electroluminescent devices (hereinafter abbreviated to organic EL devices) with such features as high efficiency, thinness, lightweight, and low viewing angle dependency, have attracted attention. Displays using such organic EL devices are actively being developed.

An organic EL device is a self-emitting type of device. In the organic EL device, an electron injection electrode and a hole injection electrode inject electrons and holes, respectively, to a luminescent portion, where the injected electrons and holes are recombined at a luminescent center to bring organic molecules into excited states, and the organic molecules fluoresce when return from their excited states to ground states.

Organic EL devices can emit a variety of colors of light depending on the selection of fluorescent materials which are the luminescent materials, which makes them increasingly promising for applications in displays such as a multi-color display or full-color display. Since the organic EL devices can emit light on a surface at low voltage, they can also be utilized as the backlights for liquid crystal displays, etc. Applications of such organic EL devices to small displays such as digital cameras or cellular phones are currently in the development phase.

An organic EL device typically has a structure that includes a hole injection electrode, hole injection layer, hole transport layer, light emitting layer, electron transport layer, electron injection layer, and electron injection electrode in order on a substrate. The hole injection layer, hole transport layer, light emitting layer, electron transport layer, and electron injection layer will hereinafter be referred to as organic layers.

In realizing a full-color display with such organic EL devices, it is necessary to form each of the organic EL devices independently, which emit the three primary colors of red, green, and blue, respectively. This makes the fabrication processes complicated.

In order to avoid such complication of the fabrication processes, a combined use of a white light emitting device and color filter layers that transmit the monochromatic lights of three primary colors makes a full-color display possible (refer to JP H11-260562 A, for example). Such a white light emitting device, which contains a blue light emitting material and an orange light emitting material, can simultaneously emit blue and orange lights produced by the blue and orange light emitting materials so as to realize the emission of white light. In the emission spectrum of the above-mentioned white light emitting device, there are emission peaks for the blue and orange, respectively.

However, these two emission peaks are so broad that an emission peak for the green is hardly present. This results in lowered color purities of red, green, and blue, which therefore prevents emissions of red, green, and blue lights with high color purities from being attained.

SUMMARY OF THE INVENTION

An object of the present invention is to provide an organic electroluminescent display which can offer emissions of red, green, and blue lights with high color purities that maintain a good color balance. According to the present invention there is provided an organic electroluminescent display comprising a light emitting layer that produces light having peak intensities in a wavelength range of not less than 460 nm and not more than 510 nm and a wavelength range of not less than 550 nm and not more than 640 nm, respectively, and first, second, and third color filters that are disposed so as to transmit the light produced by the light emitting layer, the first color filter having a transmittance of 50% or more in a wavelength range of not less than 580 nm and not more than 660 nm and a transmittance of 10% or less in a wavelength range of not less than 400 nm and not more than 550 nm, the second color filter having a transmittance of 50% or more in a wavelength range of not less than 480 nm and not more than 590 nm and a transmittance of 10% or less in a wavelength range of not less than 400 nm and not more than 460 nm and a wavelength range of not less than 620 nm and not more than 660 nm, the third color filter having a transmittance of 50% or more in a wavelength range of not less than 430 nm and not more than 530 nm and a transmittance of 10% or less in a wavelength range of not less than 580 nm and not more than 700 nm.

In the organic electroluminescent display according to the invention, the light emitting layer produces the light having peak intensities in the wavelength range of not less than 460 nm and not more than 510 nm and the wavelength range of not less than 550 nm and not more than 640 nm, respectively. The light produced from the light emitting layer passes through the first color filter that has a transmittance of 50% or more in the wavelength range of not less than 580 nm and not more than 660 nm and a transmittance of 10% or less in the wavelength range of not less than 400 nm and not more than 550 nm, resulting in red light with a high color purity. The light produced from the light emitting layer passes through the second color filter that has a transmittance of 50% or more in the wavelength range of not less than 480 nm and not more than 590 nm and a transmittance of 10% or less in the wavelength range of not less than 400 nm and not more than 460 nm and the wavelength range of not less than 620 nm and not more than 660 nm, resulting in green color with a high color purity. The light produced from the light emitting layer passes through the third color filter that has a transmittance of 50% or more in the wavelength range of not less than 430 nm and not more than 530 nm and a transmittance of 10% or less in the wavelength range of not less than 580 nm and not more than 700 nm, resulting in blue light with a high color purity. Consequently, emissions of red, green, and blue lights with high color purities that maintain a good color balance can be obtained.

It is preferred that a ratio of an intensity value of the light emitted from the light emitting layer at a wavelength of 575 nm to an intensity value of the light emitted from the light emitting layer at a wavelength of 475 nm is not less than 0.4 and not more than 4.0. This results in emissions of red, green, and blue lights with higher color purities that maintain a good color balance.

It is preferred that a ratio of a luminance value of the light passed through the third color filter to a luminance value of the light passed through the first color filter is not less than 0.37 and not more than 2.73. This results in emissions of red, green, and blue lights with even higher color purities that maintain a good color balance.

It is preferred that a ratio of a luminous efficiency of the light passed through the third color filter to a luminous efficiency of the light passed through the first color filter is not less than 0.37 and not more than 2.73. This results in emissions of red, green, and blue lights with still higher color purities that maintain a good color balance.

The light emitting layer may include a first light emitting layer that emits light with a peak intensity in a wavelength range of not less than 550 nm and not more than 640 nm and a second light emitting layer that emits light with a peak intensity in a wavelength range of not less than 460 nm and not more than 510 nm. In this manner, light having peak intensities in the wavelength range of not less than 460 nm and not more than 510 nm and wavelength range of not less than 550 nm and not more than 640 nm, respectively, can be efficiently obtained.

The organic electroluminescent display according to the present invention can offer emissions of red, green, and blue lights with high color purities that maintain a good color balance.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a schematic diagram showing the cross section of an organic EL display according to an embodiment;

FIG. 2 is a cross-sectional view showing the structure of the organic EL display of FIG. 1 in detail;

FIG. 6 is an explanatory diagram showing the intensities of the emission spectrum of the light emitting layer in an organic EL display of a second inventive example;

FIG. 12 is an explanatory diagram showing the intensities of the emission spectrum of the light emitting layer in an organic EL display of a second comparative example;

DESCRIPTION OF THE PREFERRED EMBODIMENTS

Figure 3:
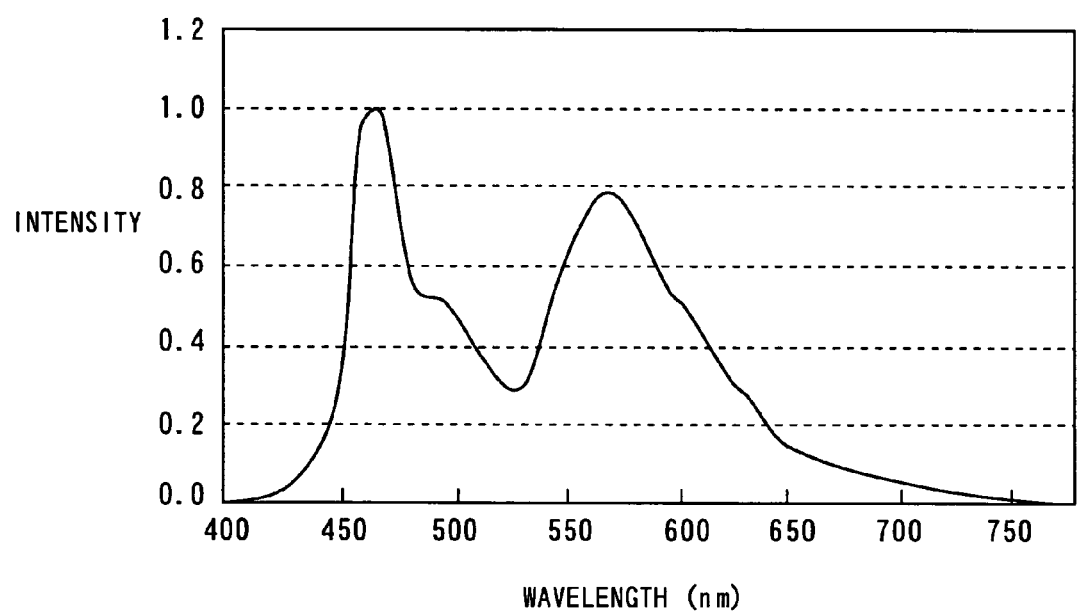
FIG. 3 is an explanatory diagram showing the emission spectrum of the light emitting layer in the organic EL display.

An organic electroluminescent (hereinafter referred to as an organic EL) display according to the present invention will be described below referring to the drawings.

FIG. 1 is a schematic diagram that shows the cross-section of an organic EL display according to the present embodiment. FIG. 2 is a cross-sectional view that shows the structure of the organic EL display of FIG. 1 in detail.

The organic EL display according to the embodiment mainly comprises an organic EL device 50, a red color filter layer CFR, a green color filter layer CFG, a blue color filter layer CFB, and a substrate 1, as shown in FIG. 1.

The red color filter layer CFR, green color filter layer CFG, and blue color filter layer CFB are formed between the organic EL device 50 and the substrate 1. The three kinds of adjacent red color filter layer CFR, green color filter layer CFG, and blue color filter layer CFB are disposed such that they form a single pixel of the organic EL display.

Now referring to FIG. 2, detailed structure of the organic EL display of FIG. 1 will be described. As shown in FIG. 2, a laminated film 11 that includes, for example, a layer made of a silicon oxide ($SiO_2$) and a layer made of a silicon nitride (SiNx) is formed on a transparent substrate 1 made of glass or plastic. The silicon oxide layer of the laminated film 11 is 130 nm in thickness, for example, and the silicon nitride layer is 50 nm in thickness, for example.

A TFT (thin-film transistor) 20 is partially formed on the laminated film 11. A drain electrode 13d and a source electrode 13s are formed on the TFT 20.

The drain electrode 13d of the TFT 20 is connected to a hole injection electrode 2 mentioned below, and the source electrode 13s of the TFT 20 is connected to a power supply line (not illustrated).

A first interlayer insulating film 16 is formed on a gate oxide film 14 so as to cover a gate electrode 15. A second interlayer insulating film 17 is formed on the first interlayer insulating film 16 so as to cover the drain electrode 13d and the source electrode 13s.

Note that the gate oxide film 14 has a laminated structure that includes a layer made of a silicon nitride and a layer made of a silicon oxide, for example. The silicon nitride layer of the gate oxide film 14 is 20 nm in thickness, for example, and the silicon oxide layer is 80 nm in thickness, for example. The gate electrode 15 is 235 nm in thickness, for example, and connected to an electrode (not illustrated). The first interlayer insulating film 16 has a laminated structure that includes a layer made of a silicon oxide and a layer made of a silicon nitride, for example.

The silicon oxide layer of the first interlayer insulating film 16 is 500 nm in thickness, for example, and the silicon nitride layer is 100 nm in thickness, for example. The second interlayer insulating film 17 is made of a silicon nitride having a thickness of 300 nm, for example.

The red color filter layer CFR, green color filter layer CFG, and blue color filter layer CFB are formed, respectively, on the second interlayer insulating film 17. The red color filter layer CFR transmits light in the red wavelength range, the green color filter layer CFG transmits light in the green wavelength range, and the blue color filter layer CFB transmits light in the blue wavelength range. In FIG. 1, the red color filter layer CFR is illustrated as an example.

The red color filter layer CFR has a transmittance of 50% or more in a wavelength range of not less than 580 nm and not more than 660 nm and a transmittance of 10% or less in a wavelength range of not less than 400 nm and not more than 550 nm. The green color filter layer CFG has a transmittance of 50% or less in a wavelength range of not less than 480 nm and not more than 590 nm and a transmittance of 10% or less in a wavelength range of not less than 400 nm and not more than 460 nm and a wavelength range of not less than 620 nm and not more than 660 nm. The blue color filter layer CFB has a transmittance of 50% or more in a wavelength range of not less than 430 nm and not more than 530 nm and a transmittance of 10% or less in a wavelength range of not less than 580 nm and not more than 700 nm.

A first planarization layer 18, which is made of an acrylic resin for example, is formed on the second interlayer insulating film 17 so as to cover the red color filter layer CFR, green color filter layer CFG, and blue color filter layer CFB. For each pixel, a transparent hole injection electrode 2 is formed on the first planarization layer 18, and an insulative second planarization layer 19 is formed in a region between pixels so as to cover the hole injection electrode 2. Note that the hole injection electrode 2 is made of a transparent conductive film which is made of such materials as indium-tin oxide (ITO), for example.

A hole injection layer 3 is formed to cover the hole injection electrode 2 and the second planarization layer 19. The hole injection layer 3 has a laminated structure that includes a first injection layer 3a and a second injection layer 3b.

The first injection layer 3a of the hole injection layer 3 is made of copper phthalocyanine (CuPc), for example, and has a thickness of 100 Å, for example. The second injection layer 3b of the hole injection layer 3 is made of carbon fluoride (CFx), for example, and has a thickness of several Å.

A hole transport layer 4, an orange light emitting layer 5a that emits in orange, a blue light emitting layer 5b that emits in blue, and an electron transport layer 6 are formed in order on the hole injection layer 3. On the electron transport layer 6, an electron injection electrode 7 with a laminated structure that includes lithium fluoride (LiF) and aluminum (Al), for example, is formed.

The hole transport layer 4 is made of an organic material such as N,N'-Di(naphthalene-1-yl)-N,N'-diphenyl-benzidine (hereinafter abbreviated to NPB), for example. The hole transport layer 4 is 2400 Å in thickness, for example.

The orange light emitting layer 5a includes, for example, NPB as a host material, 5, 12-Bis(4-tert-butylphenyl)-naphthacene (hereinafter abbreviated to tBuDPN) as a first dopant, and 5, 12-Bis(4-(6-methylbenzothiazol-2-yl)phenyl) 6-11-diphenylna phthacene (hereinafter abbreviated to DBzR) as a second dopant. In this case, the second dopant emits light, and the first dopant plays a role in assisting the emission of the second dopant by encouraging the energy transfer from the host material to the second dopant. The orange light emitting layer 5a is 300 Å in thickness, for example.

Note that the orange light emitting layer 5a is doped with 20.0 wt % of tBuDNP as the first dopant, for example, and doped with 3.0 wt % of DBzR as the second dopant, for example.

The blue light emitting layer 5b includes, for example, tertiary-butyl substituted dinaphthylanthracene (hereinafter abbreviated to TBADN) as a host material, NPB as a first dopant, and 1,4,7,10-Tetra-tert-butylPerylene (hereinafter abbreviated to TBP) as a second dopant. In this case, the second dopant emits light, and the first dopant plays a role in assisting the emission of the second dopant by encouraging the carrier transport. The blue light emitting layer 5b is 400 Å in thickness, for example.

Note that the blue light emitting layer 5b is doped with 7.5 wt % of NPB as the first dopant, for example, and doped with 2.5 wt % of TBP as the second dopant, for example.

The orange light emitting layer 5a and the blue light emitting layer 5b (hereinafter referred to simply as the light emitting layer 5) produce white light having peak intensities in a wavelength range of not less than 460 nm and not more than 510 nm and a wavelength range of not less than 550 nm and not more than 640 nm, respectively.

The electron transport layer 6 is made of Tris(8-hydroxyquinolinato)aluminum (hereinafter abbreviated to Alq), for example. The electron transport layer 6 is 100 Å in thickness, for example.

The light produced from the light emitting layer 5 passes through the red color filter layer CFR that has a transmittance of 50% or more in the wavelength range of not less than 580 nm and not more than 660 nm and a transmittance of 10% or less in the wavelength range of not less than 400 nm and not more than 550 nm, resulting in red light with a high color purity that maintains a good color balance.

The light produced from the light emitting layer 5 also passes through the green color filter layer CFG that has a transmittance of 50% or more in the wavelength range of not less than 400 nm and not more than 460 nm and a transmittance of 10% or less in the wavelength range of not less than 400 nm and not more than 460 nm and the wavelength range of not less than 620 nm and not more than 660 nm, resulting in green light with a high color purity that maintains a good color balance.

The light produced from the light emitting layer 5 further passes through the blue color filter layer CFB that has a transmittance of 50% or more in the wavelength range of not less than 430 nm and not more than 530 nm and a transmittance of 10% or less in the wavelength range of not less than 580 nm and not more than 700 nm, resulting in blue light with a high color purity that maintains a good color balance.

It is preferred that the ratio of an intensity value of the light emitted from the light emitting layer 5 at a wavelength of 575 nm to an intensity value of the light emitted from the light emitting layer 5 at a wavelength of 475 nm is not less than 0.4 and not more than 4.0. This results in red, green, and blue lights with higher color purities that maintain a good color balance.

It is preferred that the ratio of a luminance value or a luminous efficiency of the light passed through the blue color filter layer CFB to a luminance value or a luminous efficiency of the light passed through the red color filter layer CFR is not less than 0.37 and not more than 2.73. This results in red, green, and blue lights with even higher color purities that maintain a good color balance.

In this embodiment, the red color filter layer CFR corresponds to a first color filter, the green color filter layer CFG corresponds to a second color filter, and the blue color filter layer CFB corresponds to a third color filter. The light emitting layer 5 in this embodiment (i.e., the orange light emitting layer 5a and blue light emitting layer 5b) corresponds to a light emitting layer.

EXAMPLES

Inventive examples and comparative examples will be described below referring to the drawings. In order to obtain emissions with high color purities in each of the inventive examples and comparative examples below, the emission spectrum of a light emitting layer 5 and the transmittance of each of a red color filter layer CFR, green color filter layer CFG, and blue color filter layer CFB in a particular range of wavelengths were specified.

In the inventive example 1 and the comparative example 1, using light emitting layers 5 with the same emission spectra and red color filter layers CFR, green color filter layers CFG, and blue color filter layers CFB with different properties, the properties of the respective red color filter layers CFR, green color filter layers CFG, and blue color filter layers CFB were evaluated.

In the inventive example 2 through inventive example 4 and in the comparative example 2, using light emitting layers 5 with different emission spectra and red color filter layers CFR, green color filter layers CFG, and blue color filter layers CFB with the same properties, the emission spectra of the respective light emitting layers 5 were evaluated.

Inventive Example 1

The organic EL display of the inventive example 1 is similar in structure to the organic EL display 100 of the embodiment.

FIG. 3 is an explanatory diagram that shows the emission spectrum of the light emitting layer 5 in the organic EL display 100.

The light emitting layer 5 produces light having peak intensities in a wavelength range of not less than 460 nm and not more than 510 nm and a wavelength range of not less than 550 nm and not more than 640 nm, respectively, as shown in FIG. 3.

Figure 4:
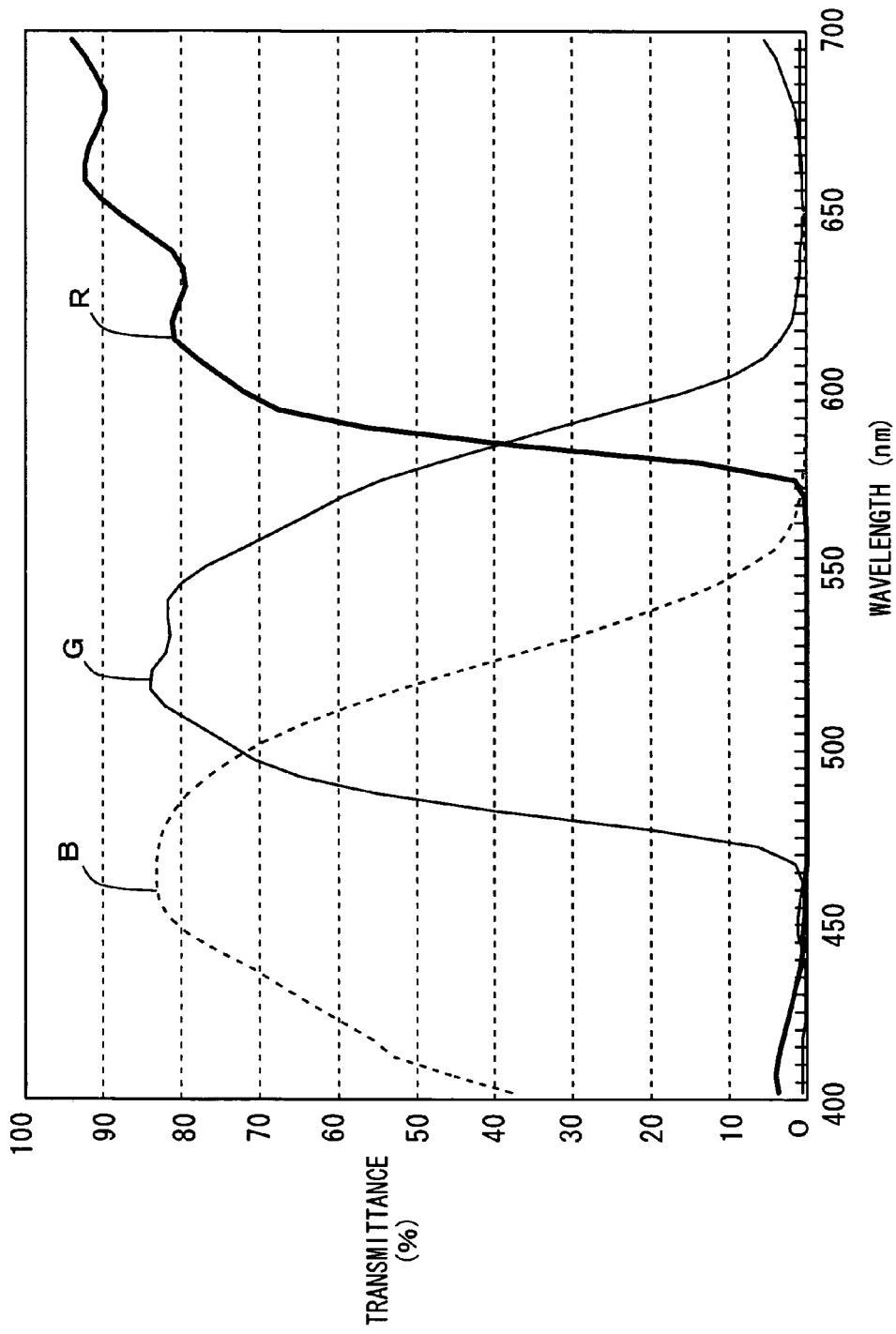
FIG. 4 is an explanatory diagram showing the transmittances of the red color filter layer, green color filter layer, and blue color filter layer in the organic EL display.

FIG. 4 is an explanatory diagram that shows the transmittances of the red color filter layer CFR, green color filter layer CFG, and blue color filter layer CFB in the organic EL display 100.

The red color filter layer CFR has a transmittance of 50% or more in a wavelength range of not less than 580 nm and not more than 660 nm and a transmittance of 10% or less in a wavelength range of not less than 400 nm and not more than 550 nm. The green color filter layer CFG has a transmittance of 50% or more in a wavelength range of not less than 480 nm and not more than 590 and a transmittance of 10% or less in a wavelength range of not less than 400 nm and not more than 460 nm and a wavelength range of not less than 620 nm and not more than 660 nm. The blue color filter layer CFB has a transmittance of 50% or more in a wavelength range of not less than 430 nm and not more than 530 nm and a transmittance of 10% or less in a wavelength range of not less than 580 nm and not more than 700 nm.

The use of the light emitting layer 5 that gives white light with the above-described peak intensities as well as each of the red color filter layer CFR, green color filter layer CFG, and blue color filter layer CFB resulted in emissions having CIE (Commission Internationale d'Eclairage) chromaticity coordinates (x, y) as follows.

That is, the CIE chromaticity coordinate (x, y) for the red was (0.64, 0.36), for the green was (0.33, 0.54), and for the blue was (0.14, 0.15).

Comparative Example 1

The differences between the organic EL display of the comparative example 1 and the organic EL display 100 used in the inventive example 1 will be described referring the drawings below.

Figure 5:
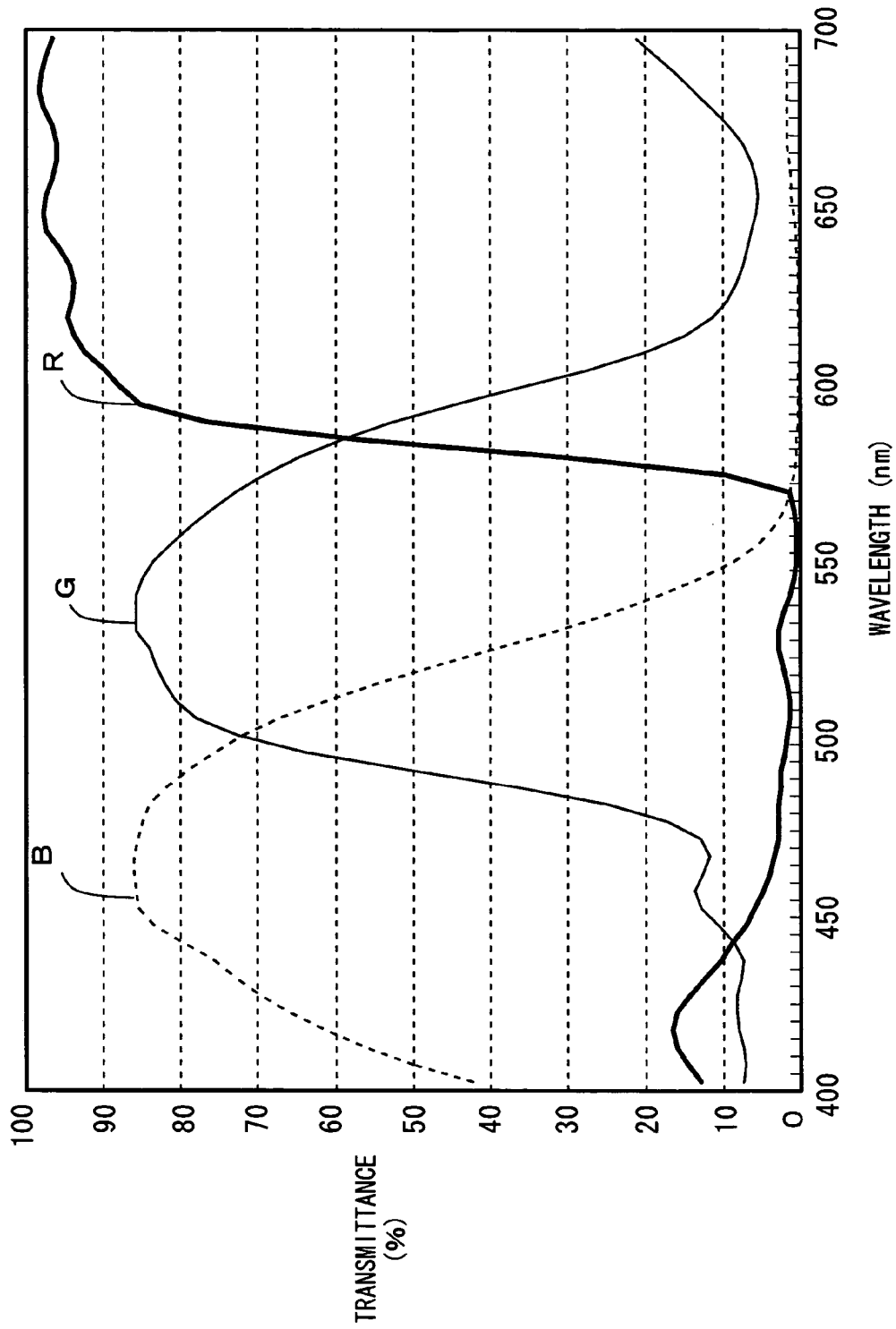
FIG. 5 is an explanatory diagram showing the transmittances of the red color filter layer, green color filter layer, and blue color filter layer in an organic EL display of a first comparative example.

FIG. 5 is an explanatory diagram that shows the transmittances of the red color filter layer CFR, green color filter layer CFG, and blue color filter layer CFB in the organic EL display of this comparative example.

The red color filter layer CFR in the organic EL display of the comparative example has a transmittance of lower than 50% in a wavelength range of not less than 580 nm and not more than 590 nm within a wavelength range of not less than 580 nm and not more than 660 nm. The red color filter layer CFR also has a transmittance of over 10% in a wavelength range of not less than 400 nm and not more than 440 nm within a wavelength range of not less than 400 nm and not more than 550 nm.

The green color filter layer CFG has a transmittance of lower than 50% in a wavelength range of not less than 480 nm and not more than 490 nm within a wavelength range of not less than 480 nm and not more than 590 nm. The green color filter layer CFG also has a transmittance of over 10% in a wavelength range of not less than 450 nm and not more than 460 nm within a wavelength range of not less than 400 nm and not more than 460 nm.

The blue color filter layer CFB has a transmittance of lower than 50% in a wavelength range of not less than 525 nm and not more than 530 nm within a wavelength range of not less than 430 nm and not more than 530 nm.

The CIE chromaticity coordinate (x, y) for the red was (0.58, 0.37), for the green was (0.30, 0.53), and for the blue was (0.13, 0.18).

(Evaluation 1)

The organic EL display 100 of the inventive example 1 proved to provide color purities close to the reference values of the CIE chromaticity coordinates for the emission colors in the NTSC (National Television Standards Committee)—system CRTS (cathode-ray tubes).

Note that the reference values (Spec) of the CIE chromaticity coordinates (x, y) for the emission colors in the NTSC-system CRTs are: (0.67, 0.33) for the red; (0.21, 0.71) for the green; and (0.14, 0.08) for the blue.

In contrast, the organic EL display of the comparative example 1 proved to provide a poor red color purity as compared to the above-mentioned reference value of the CIE chromaticity coordinate.

This shows that the red color filter layer CFR preferably has a transmittance of 50% or more in the wavelength range of not less than 580 nm and not more than 660 nm and a transmittance of 10% or less in the wavelength range of not less than 400 nm and not more than 550 nm; the green color filter layer CFG preferably has a transmittance of 50% or more in the wavelength range of not less than 480 nm and not more than 590 nm and a transmittance of 10% or less in the wavelength range of not less than 400 nm and not more than 460 nm and the wavelength range of not less than 620 nm and not more than 660 nm; and the blue color filter layer CFB preferably has a transmittance of 50% or more in the wavelength range of not less than 430 nm and not more than 530 nm and a transmittance of 10% or less in the wavelength range of not less than 580 nm and not more than 700 nm.

Inventive Example 2

The differences between the organic EL display of the inventive example 2 and the organic EL display 100 used in the inventive example 1 will be described referring to the drawings below.

FIG. 6 is an explanatory diagram that shows the intensities of the emission spectrum of the light emitting layer 5 in the organic EL display of this inventive example.

The light emitting layer 5 produced light having peak intensities in a wavelength range of not less than 460 nm and not more than 510 nm and in a wavelength range of not less than 550 nm and not more than 640 nm, respectively. The luminous efficiency of the light was 13.4 cd/A.

The ratio of an intensity value of the light emitted from the light emitting layer 5 at a wavelength of 575 nm to an intensity value of the light emitted at a wavelength of 475 nm (which will hereinafter be referred to as an intensity ratio) was 1.47.

The luminous efficiencies of the lights passed through the red color filter layer CFR, green color filter layer CFG, and blue color filter layer CFB, respectively, were measured with a luminance meter. The luminous efficiency of the light passed through the red color filter layer CFR was 2.49 cd/A, that of the light passed through the green color filter layer CFG was 7.19 cd/A, and that of the light passed through the blue color filter layer CFB was 2.31 cd/A.

The ratio of the luminous efficiency of the light passed through the blue color filter layer to the luminous efficiency of the light passed through the red color filter layer CFR (which will hereinafter be referred to as an efficiency ratio) was 1.08.

Figure 7:
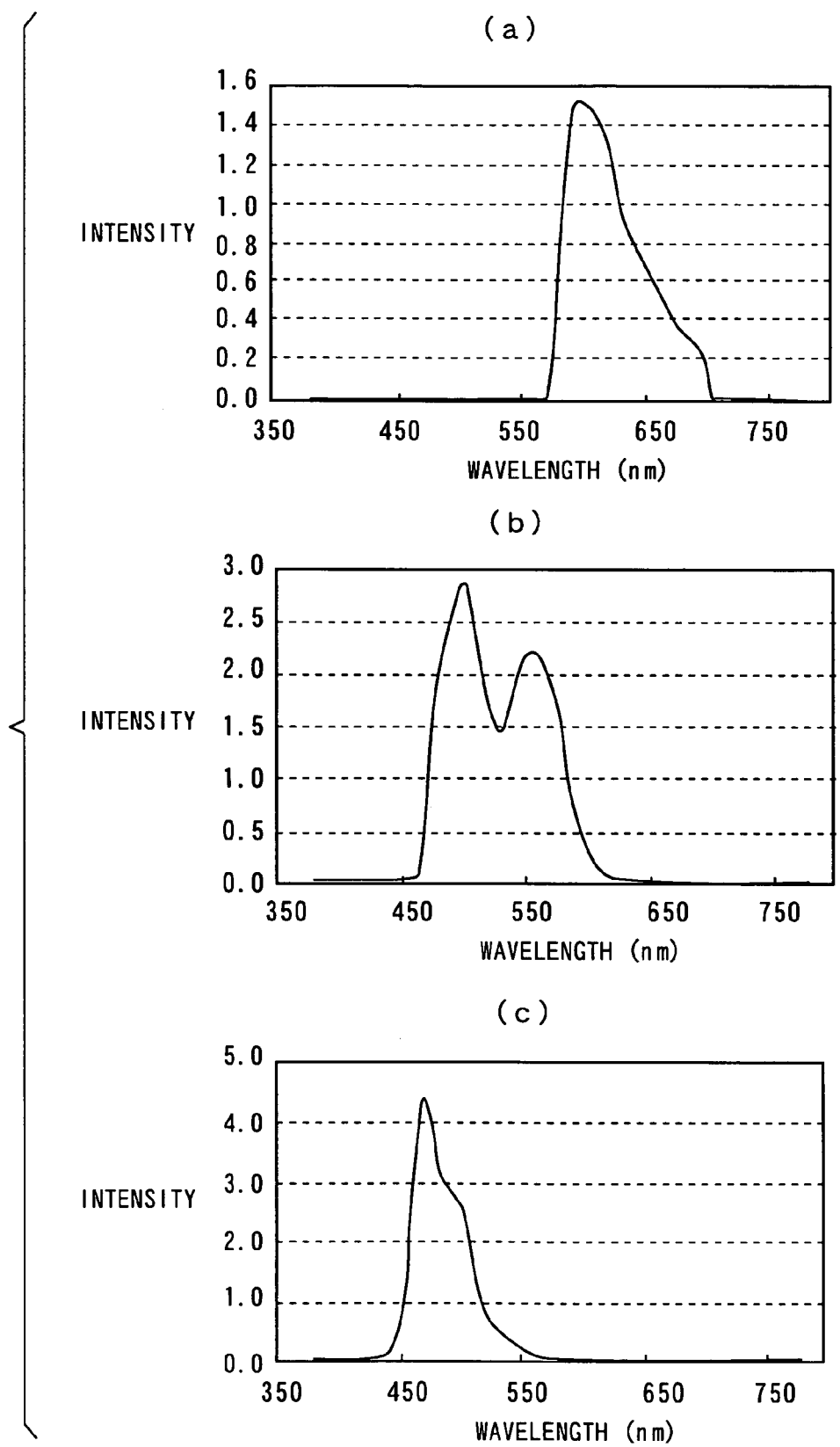
FIGS. 7(a), 7(b), and 7(c) are explanatory diagrams showing the emission spectra of the lights passed through the color filter layers of the respective colors.

FIGS. 7(a), 7(b), and 7(c) are explanatory diagrams that show the emission spectra of the lights passed through the color filter layers of the respective colors.

As shown in FIG. 7(a), the light passed through the red color filter layer CFR had a peak intensity in a wavelength range of not less than 580 nm and not more than 660 nm.

As shown in FIG. 7(b), the light passed through the green color filter layer CFG had a peak intensity in a wavelength range of not less than 480 nm and not more than 590 nm.

As shown in FIG. 7(c), the light passed through the blue color filter layer CFB had a peak intensity in a wavelength range of not less than 430 nm and not more than 530 nm.

Inventive Example 3

The differences between the organic EL display of the inventive example 3 and the organic EL display used in the inventive example 2 will be described referring to the drawings below.

Figure 8:
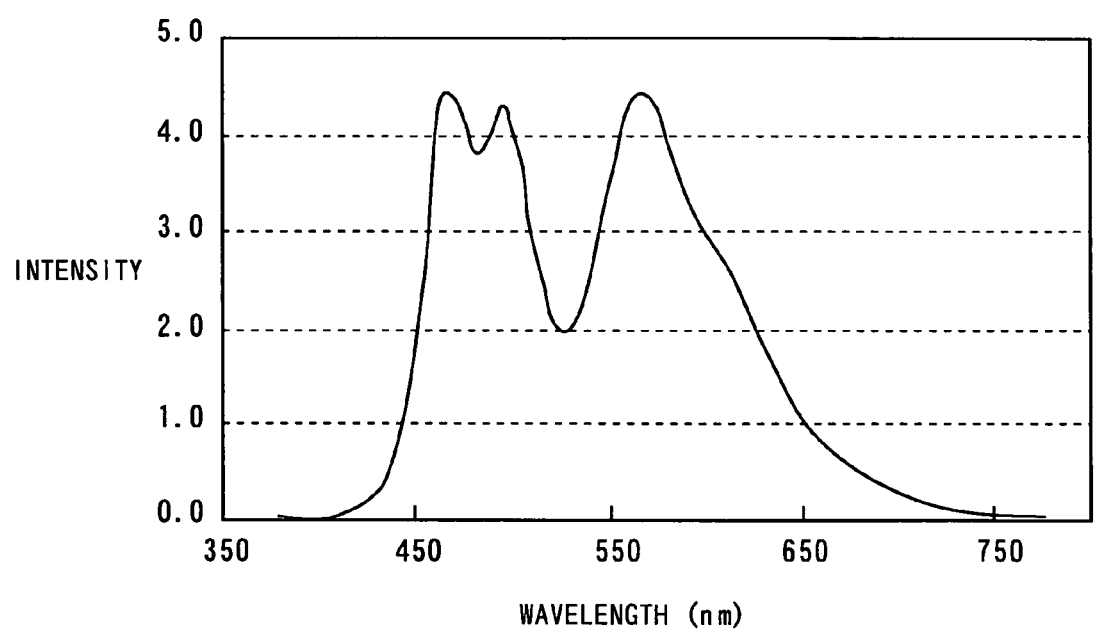
FIG. 8 is an explanatory diagram showing the intensities of the emission spectrum of the light emitting layer in an organic EL display of a third inventive example.

FIG. 8 is an explanatory diagram that shows the intensities of the emission spectrum of the light emitting layer 5 in the organic EL display of this inventive example.

As shown in FIG. 8, the light emitting layer produced light having peak intensities in a wavelength range of not less than 460 nm and not more than 510 nm and in a wavelength range of not less than 550 nm and not more than 640 nm, respectively. The luminous efficiency of the light was 12.1 cd/A. The intensity ratio was 1.00.

The luminous efficiencies of the lights passed through the red color filter layer CFR, green color filter layer CFG, and blue color filter layer CFB, respectively, were measured with a luminance meter. The luminous efficiency of the light passed through the red color filter layer CFR was 2.08 cd/A, that of the light passed through the green color filter layer CFG was 6.69 cd/A, and that of the light passed through the blue color filter layer CFB was 1.97 cd/A. The efficiency ratio was 1.08.

Figure 9:
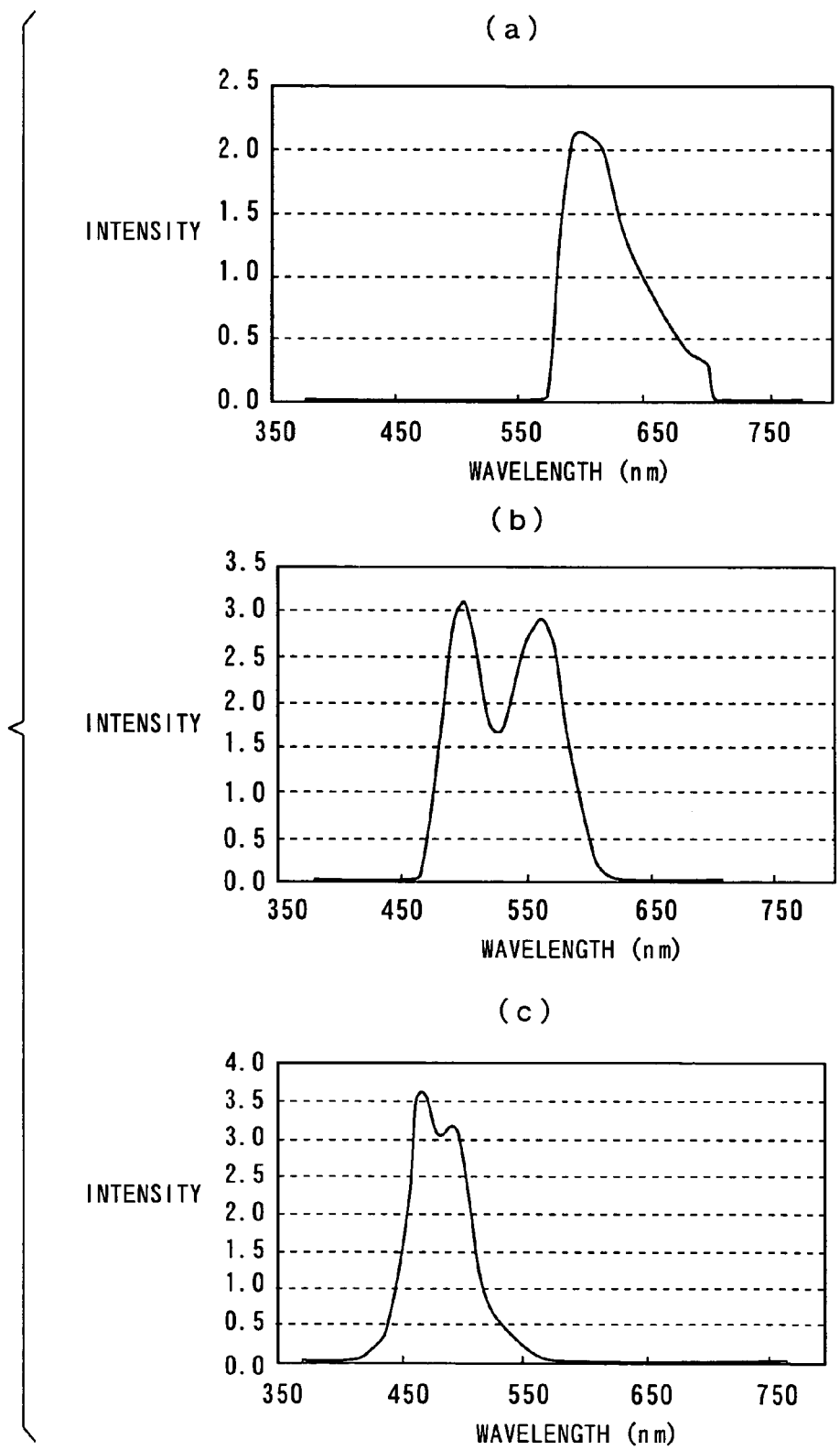
FIGS. 9(a), 9(b), and 9(c) are explanatory diagrams showing the emission spectra of the lights passed through the color filter layers of the respective colors.

FIGS. 9(a), 9(b), and 9(c) are explanatory diagrams that show the emission spectra of the lights passed through the color filter layers of the respective colors.

As shown in FIG. 9(a), the light passed through the red color filter layer CFR had a peak intensity in a wavelength range of not less than 580 nm and not more than 660 nm.

As shown in FIG. 9(b), the light passed through the green color filter layer CFG had a peak intensity in a wavelength range of not less than 480 nm and nor more than 590 nm.

As shown in FIG. 9(c), the light passed through the blue color filter layer CFB had a peak intensity in a wavelength range of not less than 430 nm and not more than 530 nm.

Inventive Example 4

The differences between the organic EL display of the inventive example 4 and the organic EL display used in the inventive example 2 will be described referring to the drawings below.

Figure 10:
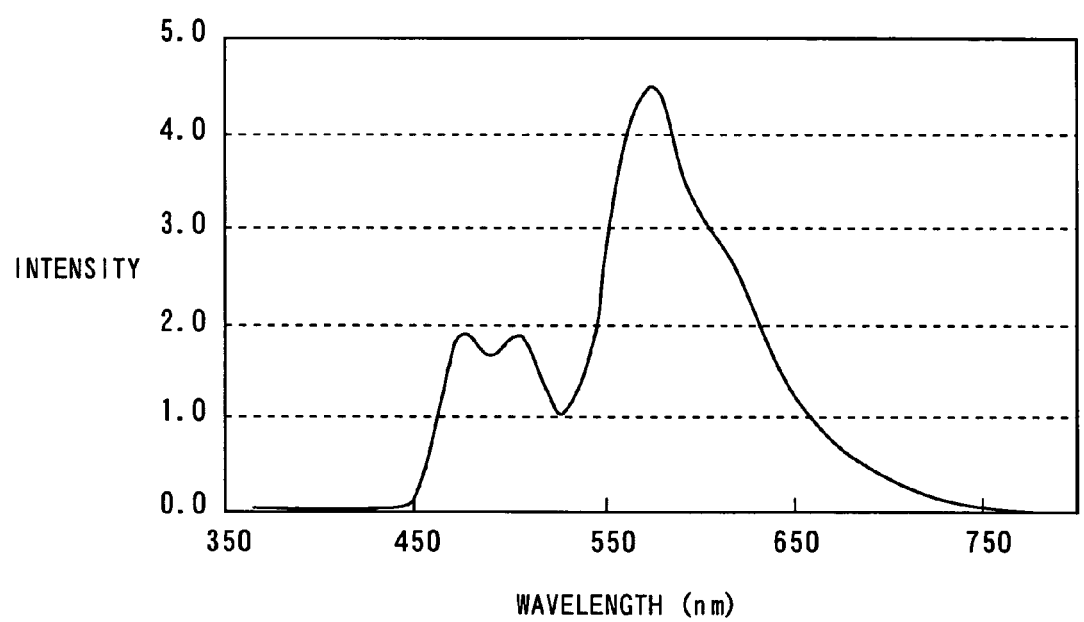
FIG. 10 is an explanatory diagram showing the intensities of the emission spectrum of the light emitting layer in an organic EL display of a fourth inventive example.

FIG. 10 is an explanatory diagram that shows the intensities of the emission spectrum of the light emitting layer 5 in the organic EL display of this inventive example.

As shown in FIG. 10, the light emitting layer 5 produced light having peak intensities in a wavelength range of not less than 460 nm and not more than 510 nm and in a wavelength range of not less than 550 nm and not more than 640 nm, respectively. The luminous efficiency of the light was 17.8 cd/A, and the intensity ratio was 0.44.

The luminous efficiencies of the lights passed through the red color filter layer CFR, green color filter layer CFG, and blue color filter layer CFB, respectively, were measured with a luminance meter. The luminous efficiency of the light passed through the red color filter layer CFR was 3.92 cd/A, that of the light passed through the green color filter layer CFG was 9.13 cd/A, and that of the blue color filter layer CFB was 1.81 cd/A. The efficiency ratio was 2.17.

Figure 11:
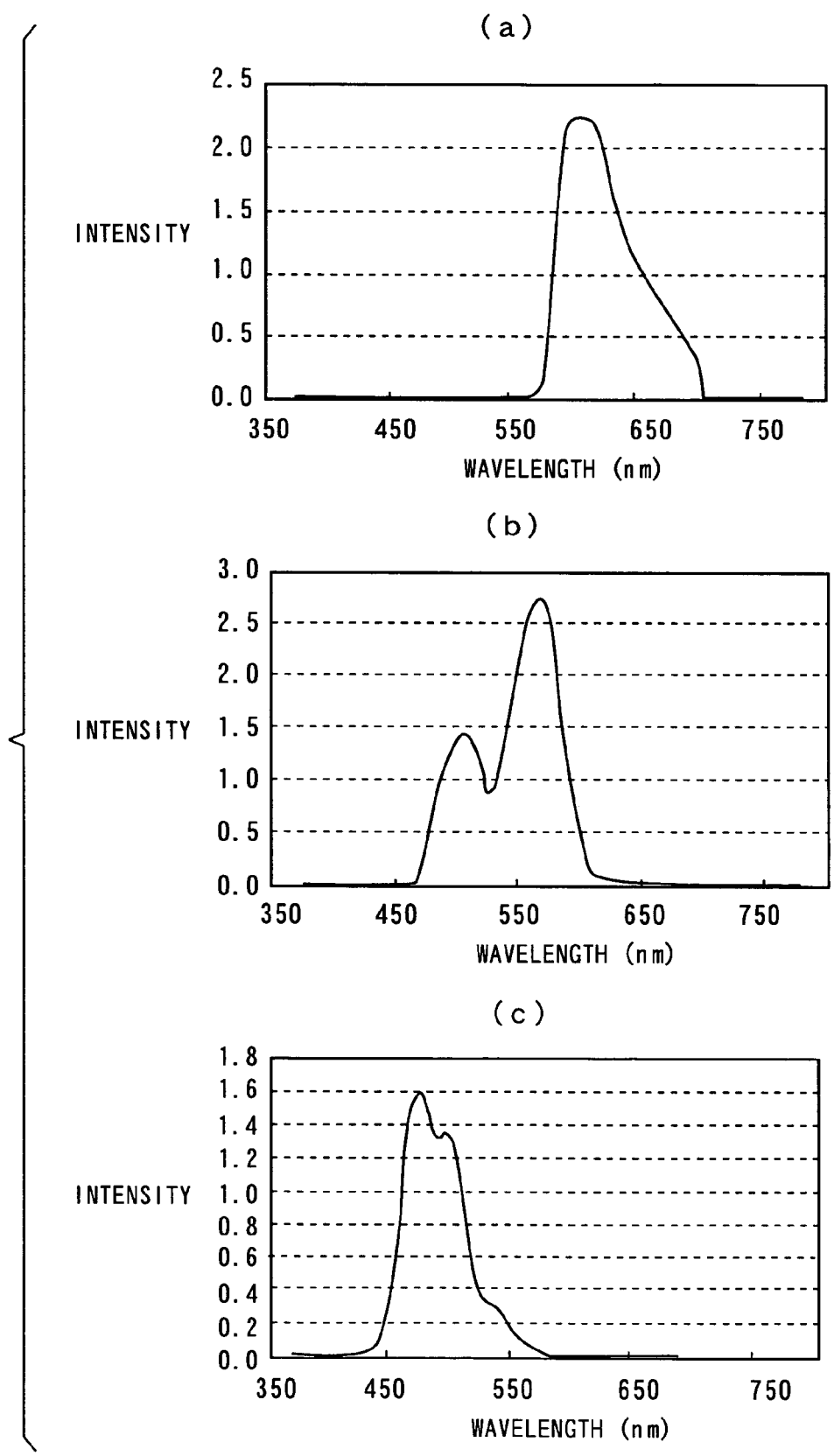
FIGS. 11(a), 11(b), and 11(c) are explanatory diagrams showing the emission spectra of the lights passed through the color filter layers of the respective colors.

FIGS. 11(a), 11(b), and 11(c) are explanatory diagrams that show the emission spectra of the lights passed through the color filters of the respective colors.

As shown in FIG. 11(a), the light passed through the red color filter layer CFR had a peak intensity in a wavelength range of not less than 580 nm and not more than 660 nm.

As shown in FIG. 11(b), the light passed through the green color filter layer CFG had a peak intensity in a wavelength range of not less than 480 nm and not more than 590 nm.

As shown in FIG. 11(c), the light passed through the blue color filter layer CFB had a peak intensity in a wavelength range of not less than 430 nm and not more than 530 nm.

Comparative Example 2

The differences between the organic EL display of the comparative example 2 and the organic EL display used in the inventive example 2 will be described referring to the drawings below.

FIG. 12 is an explanatory diagram that shows the intensities of the emission spectrum of the light emitting layer 5 in the organic EL display of this comparative example.

As shown in FIG. 12, the light emitting layer 5 produced light that had a peak intensity in a wavelength range of not less than 460 nm and not more than 510 nm, but did not have a peak intensity in a wavelength range of not less than 550 nm and not more than 640 nm. The luminous efficiency of the light was 11.0 cd/A, and the intensity ratio was 6.91.

The luminous efficiencies of the lights passed through the red color filter layer CFR, green color filter layer CFG, and blue color filter layer CFB, respectively, were measured with a luminance meter. The luminous efficiency of the light passed through the red color filter layer CFR was 0.78 cd/A, that of the light passed through the green color filter layer CFG was 7.05 cd/A, and that of the light passed through the blue color filter layer CFB was 3.82 cd/A. The efficiency ratio was 0.20.

Figure 13:
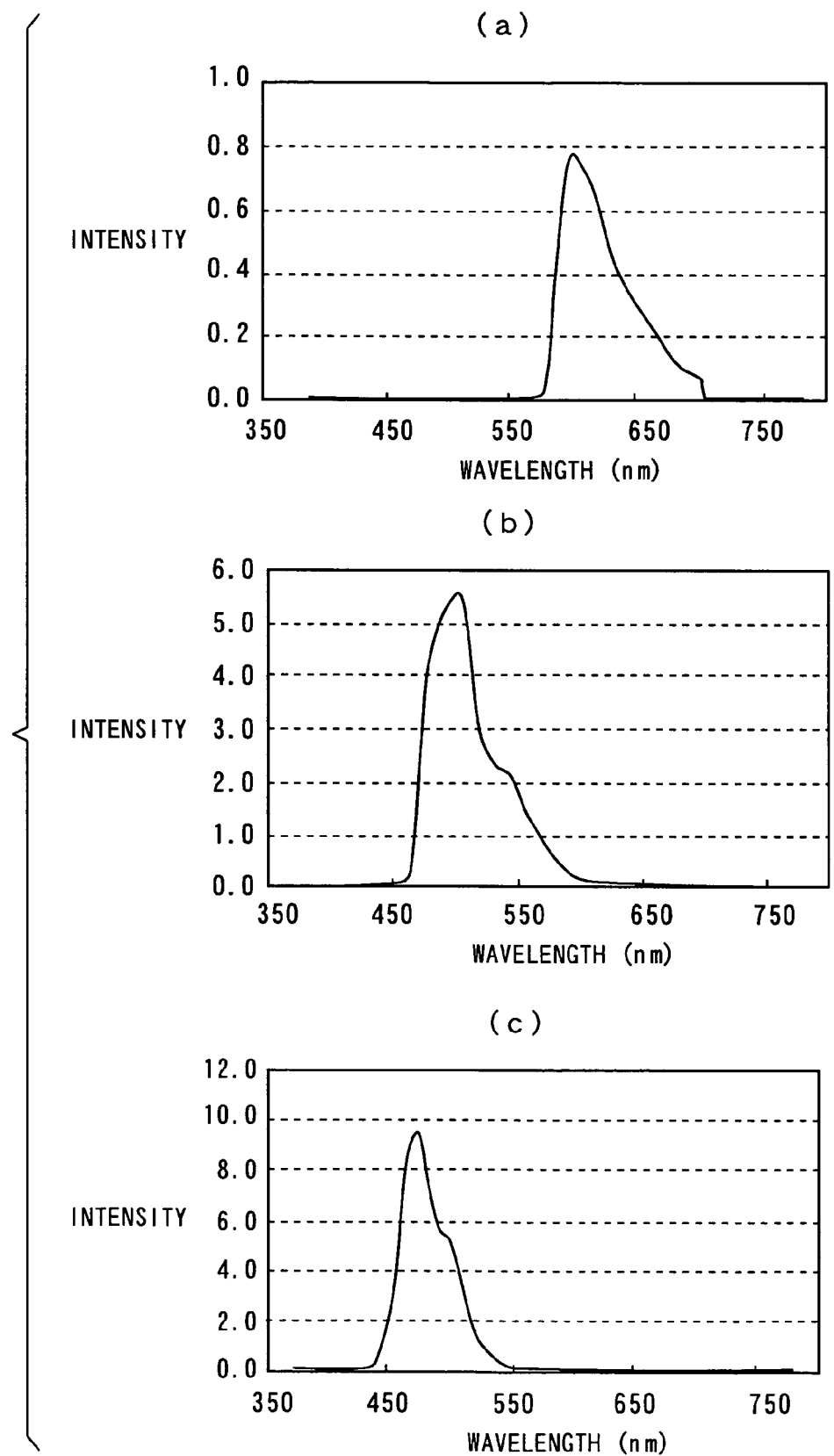
FIGS. 13(a), 13(b), and 13(c) are explanatory diagrams showing the emission spectra of the lights passed through the color filter layers of the respective colors.

FIGS. 13(a), 13(b), and 13(c) are explanatory diagrams that shows the emission spectra of the lights passed through the color filter layers of the respective colors.

As shown in FIG. 13(a), the light passed through the red color filter layer CFR had a peak intensity in a wavelength range of not less than 580 nm and not more than 660 nm.

As shown in FIG. 13(b), the light passed through the green color filter layer CFG had a peak intensity in a wavelength range of not less than 480 nm and not more than 590 nm.

As shown in FIG. 13(c), the light passed through the blue color filter layer CFB had a peak intensity in a wavelength range of not less than 430 nm and not more than 530 nm.

Evaluation 2

The values of the intensity ratios and efficiency ratios in the above-described inventive example 2 through inventive example 4 and the comparative example 2 were plotted on a double logarithmic graph as shown below. The abscissa represents the intensity ratio, and the ordinate represents the efficiency ratio.

Figure 14:
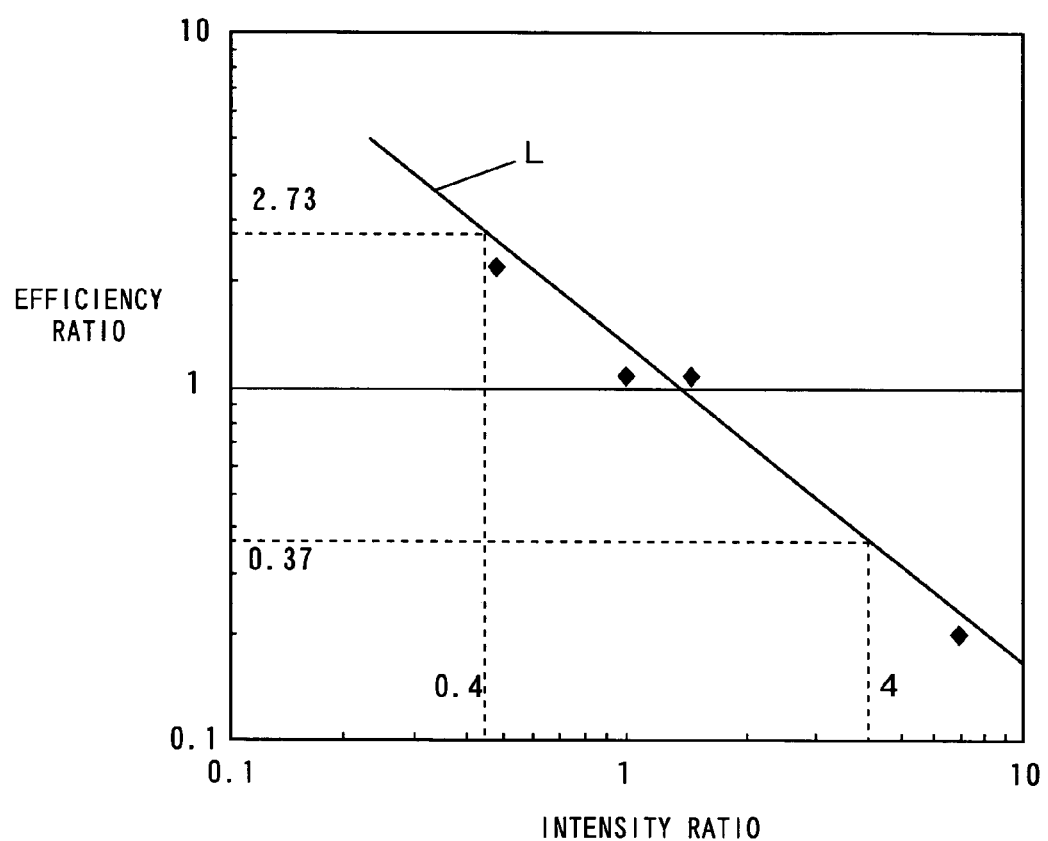
FIG. 14 is an explanatory diagram showing a relation between the intensity ratio and the efficiency ratio.

FIG. 14 is an explanatory diagram that shows a relation between the intensity ratio and the efficiency ratio. It was found that the relation between the intensity ratio and the efficiency ratio could be approximated by the straight line L, as shown in FIG. 14.

In general, when making color adjustments in a full-color organic EL display, the ratio between the luminance values of red and blue is preferably one in terms of low power consumption (condition 1). The reason why the luminance values of red and blue were chosen in this case for determining the luminance value ratio is that the red and the blue peak intensities are responsible for the emission spectrum of the white light produced by the light emitting layer 5. It is thus preferred to set the ratio between the luminance values of red and blue in a region of a prescribed width with one at the center.

Meanwhile, when reproducing the reference values of the CIE chromaticity coordinates for the emission colors in the NTSC-system CRTs, the ratio of the luminance values of red, green, and blue should be 30:59:11, respectively (condition 2) (*Organic EL Materials and Displays*, Junji Kido ed.: CMC Publishing Co., Ltd., 1st edition, 28th Feb. 2001, 345-353). In this case, the ratio between the red and blue is 30/11, that is, 2.73.

Based on the aforementioned condition 2, it is thus preferred that the upper limit for the ratio between the luminance values of red and blue is set to 2.73, and the lower limit for the ratio between the luminance values of blue and red is set to the inverse of this upper limit. The lower limit of the ratio between the luminance values of blue and red is thus 11/30, that is, 0.37.

Consequently, it is preferred that the ratio between the luminance values of red and blue is set in a range of not less than 0.37 and not more than 2.73.

Since there is a correlation between the above-mentioned luminance value ratio and the luminous efficiency ratio, the range of luminance value ratios may be substituted with the range of luminous efficiency ratios. Accordingly, the optimal range of the efficiency ratios for obtaining red, green, and blue lights with high color purities is not less than 0.37 and not more than 2.74 (condition 3).

Based on the straight line L and the efficiency ratios of 0.37 and 2.73 as shown in FIG. 14, the optimal range of intensity ratios when reproducing the reference values of the CIE chromaticity coordinates for the emission colors in the NTSC-system CRTs is not less than 0.4 and not more than 4.0 (condition 4).

The values of the efficiency ratio and intensity ratio in each of the inventive example 2 through inventive example 4, respectively, satisfy the aforementioned condition 3 and condition 4, whereas the values of the efficiency ratio and intensity ratio in the comparative example 2 fail to satisfy the condition 3 and condition 4.

This shows that it is preferred that the light produced from the light emitting layer has peak intensities in the wavelength range of not less than 460 nm and not more than 510 nm and in the wavelength range of not less than 550 nm and not more than 640 nm, respectively. Also, it is preferred that the efficiency ratio is in the range of not less than 0.37 and not more than 2.73, and the intensity ratio is in the range of not less than 0.4 and not more than 4.0.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An organic electroluminescent display comprising:
   a light emitting layer that produces light having peak intensities in a wavelength range of not less than 460 nm and not more than 510 nm and a wavelength range of not less than 550 nm and not more than 640 nm, respectively; and
   first, second, and third color filters that are disposed so as to transmit the light produced by said light emitting layer,
   said first color filter having a transmittance of 50% or more in a wavelength range of not less than 580 nm and not more than 660 nm and a transmittance of 10% or less in a wavelength range of not less than 400 nm and not more than 550 nm,
   said second color filter having a transmittance of 50% or more in a wavelength range of not less than 480 nm and not more than 590 nm and a transmittance of 10% or less in a wavelength range of not less than 400 nm and not more than 460 nm and a wavelength range of not less than 620 nm and not more than 660 nm,
   said third color filter having a transmittance of 50% or more in a wavelength range of not less than 430 nm and not more than 530 nm and a transmittance of 10% or less in a wavelength range of not less than 580 nm and not more than 700 nm.

2. The organic electroluminescent display according to claim 1, wherein
   a ratio of an intensity value of the light emitted from said light emitting layer at a wavelength of 575 nm to an intensity value of the light emitted from said light emitting layer at a wavelength of 475 nm is not less than 0.4 and not more than 4.0.

3. The organic electroluminescent display according to claim 1, wherein a ratio of a luminance value of the light passed through said third color filter to a luminance value of the light passed through said first color filter is not less than 0.37 and not more than 2.73.

4. The organic electroluminescent display according to claim 1, wherein a ratio of a luminous efficiency of the light passed through said third color filter to a luminous efficiency of the light passed through said first color filter is not less than 0.37 and not more than 2.73.

5. The organic electroluminescent display according to claim 1, wherein said light emitting layer includes a first light emitting layer that emits light with a peak intensity in a wavelength range of not less than 550 nm and not more than 640 nm and a second light emitting layer that emits light with a peak intensity in a wavelength range of not less than 460 nm and not more than 510 nm.

* * * * *